Jan. 19, 1971 F. P. HEIMAN ET AL 3,556,880
METHOD OF TREATING SEMICONDUCTOR DEVICES TO IMPROVE LIFETIME
Filed April 11, 1968
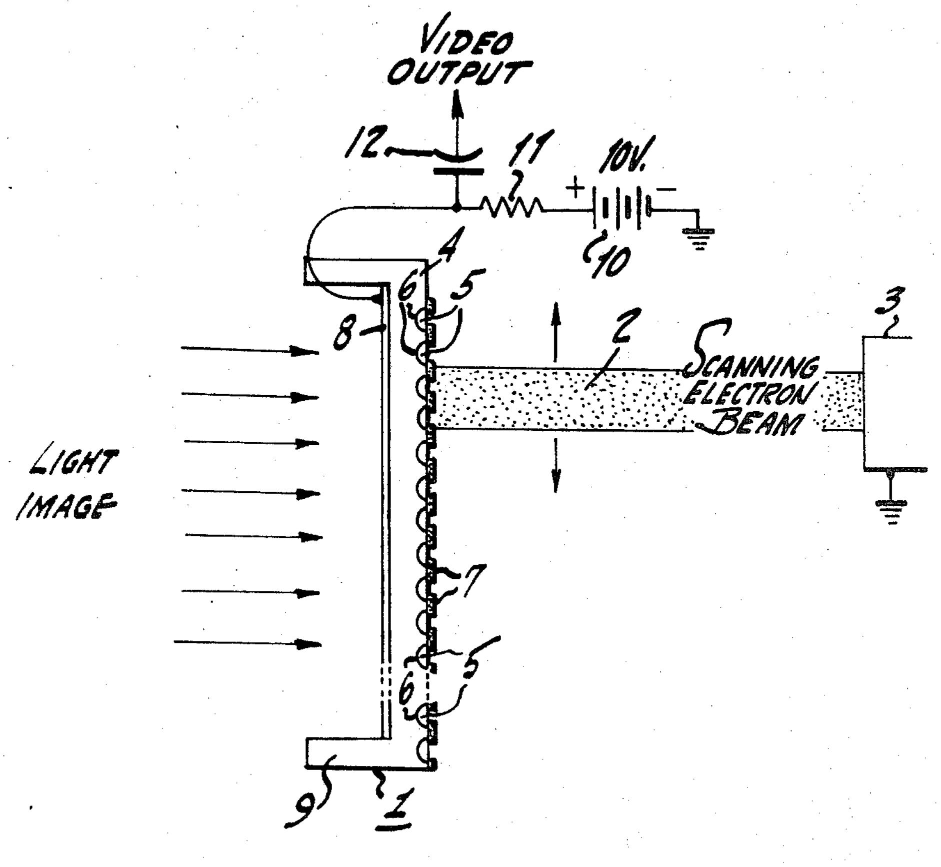
INVENTORS
Frederic P. Heiman &
Paul H. Robinson
BY [signature]
ATTORNEY United States Patent Office 3,556,880

Patented Jan. 19, 1971

3,556,880
METHOD OF TREATING SEMICONDUCTOR DEVICES TO IMPROVE LIFETIME

Frederic P. Heiman, Cranbury, and Paul H. Robinson, Trenton, N.J., assignors to RCA Corporation, a corporation of Delaware Filed Apr. 11, 1968, Ser. No. 720,538
Int. Cl. H01l 7/34, 7/44
U.S. Cl. 148—191 13 Claims

ABSTRACT OF THE DISCLOSURE

The stability and lifetime of a device comprising a semiconductor body covered by an insulating layer is improved by thermally growing at least part of the insulating layer in an atmosphere comprising oxygen and hydrogen chloride, and substantially free of water vapor. The device is heated in this atmosphere to establish a gradient for out-diffusion of certain deleterious metals from the device.

BACKGROUND OF THE INVENTION

This invention relates to a method for treating semiconductor devices so as to improve the carrier lifetime thereof.

Many semiconductor devices include at least one region of semiconductor material covered by an overlying layer of insulating material. In particular, metal-oxide-semiconductor field effect devices, as well as planar devices (in which a protective insulating layer overlies the semiconductor surface at points where one or more P-N junction regions within the semiconductor material extend to the surface), employ this construction.

In many semiconductor devices of this type, it is important that instabilities due to surface states at the semiconductor-insulator interface and to trapped charges in the insulating layer be substantially eliminated. This requirement is especially severe in field effect devices employing the insulating layer as a biased dielectric.

In other applications, such as the recently introduced silicon vidicon structure (see, e.g., E. I. Gordon, "A 'Solid-State' Electron Tube for the Picturephone Set," Bell Laboratories Record, June 1967, pp. 175–9), it is important that the semiconductor material exhibit a relatively long carrier lifetime. A technique has been developed for improving the stability of semiconductor-insulator structures of the type described by treating the insulating layer with an atmosphere which includes hydrogen chloride. This technique is described in U.S. patent application Ser. No. 714,577, filed Mar. 21, 1968 by Alfred Mayer, and assigned to the assignee of the instant application.

The specific example set forth in application Ser. No. 714,577 involves subjecting the semiconductor surface to an atmosphere comprising water vapor and hydrogen chloride. The water vapor rapidly oxidizes the semiconductor surface to (i) form the (silicon dioxide) insulating layer by thermal oxidation of the underlying silicon material, so that the insulating layer protects the semiconductor surface from undesirable etching by the hydrogen chloride gas, and the hydrogen chloride acts to (ii) convert certain deleterious metals to volatile chlorides at the exposed surface of the insulating layer, so that these chlorides leave the exposed surface to establish a gradient for out-diffusion of such deleterious metals from the semiconductor device.

While the treatment process described in application Ser. No. 714,577 substantially eliminates instability due to surface states and residual charge or polarization, it produces only a limited improvement in carrier lifetime.

Accordingly, an object of the present invention is to provide an improved method for treating semiconductor devices of the type described to considerably increase the carrier lifetime thereof.

SUMMARY OF THE INVENTION

The invention is applicable to a semiconductor device manufacturing process in which a layer of insulating material is formed on at least a part of an operating semiconductor region of an active semiconductor element. The invention relates to an improvement in which the insulating layer is exposed to an atmosphere comprising a hydrogen halide, the atmosphere being maintained substantially free of water vapor.

The semiconductor device is heated in this atmosphere at a temperature sufficient to convert a deleterious metal in the device to the metal halide. The temperature is sufficient to volatilize the halide at the exposed surface of the insulating layer so as to establish a gradient for out-diffusion of the deleterious metal from the semiconductor device toward the exposed insulating surface.

In the drawing:

FIG. 1 shows a silicon vidicon target structure manufactured according to the invention.

DETAILED DESCRIPTION

In order to provide a substantial increase in the carrier lifetime of a semiconductor material, it is necessary to remove from the material any contaminants which degrade lifetime. Such contaminants are usually present in the form of heavy metals such as gold, copper and iron which act as trapping or recombination sites.

We have found that heat treatment of the semiconductor material in an atmosphere comprising hydrogen chloride and substantially free of water vapor produces a considerable improvement in lifetime.

In a particular process, a monocrystalline silicon wafer is cleaned by conventional methods. The wafer is then gas etched at 1100° C. in an atmosphere comprising hydrogen and including a volumetric concentration of hydrogen chloride on the order of 1%. This etching treatment is carried out for a sufficient time to remove approximately 4 microns of silicon from the exposed surface of the wafer.

The wafer is then allowed to cool, and the hydrogen/hydrogen chloride atmosphere is replaced by dry oxygen. The siilcon wafer is exposed to the dry oxygen for approximately 3 minutes at a temperature on the order of 1200° C. in order to form a thin protective thermally grown silicon dioxide layer on the semiconductor surface. The purpose of this thin initial layer is to preclude undesirable etching of the silicon surface when hydrogen chloride gas is subsequently introduced into the oxygen atmosphere.

After the initial 3 minute oxidation, a 1% volumetric concentration of hydrogen chloride is introduced into the dry oxygen atmosphere, and the semiconductor wafer is treated in this atmosphere at the 1200° C. temperature for approximately 4 hours. During this time, the thickness of the oxide layer increases, and the hydrogen chloride acts to remove deleterious lifetime killing contaminants from the semiconductor-insulator structure.

After the 4 hour treatment, the atmosphere is changed to helium in order to remove any residual hydrogen chloride from the treated wafer.

The wafer is allowed to cool and then annealed in a hydrogen atmosphere at a temperature on the order of 500° C. for a time on the order of 15 minutes.

The annealing process improves performance of devices manufactured from the silicon/silicon dioxide composite by reducing or eliminating surface states at the semiconductor-insulator interface.

A capacitance-voltage curve obtained from a wafer processed according to the method described above showed no measurable oxide charge, surface states or polarization.

The carrier lifetime of a wafer processed as described above was measured by applying an evaporated aluminum electrode to the exposed surface of the silicon dioxide layer, and subjecting the resultant structure to a large voltage pulse, applied between the aluminum electrode and the semiconductor material, in a polarity so as to establish a large depletion region at the semiconductor surface adjacent the electrode. The carrier lifetime was determined by measuring the time constant associated with relaxation of the depletion region to its equilibrium condition. This measuring technique is described in detail in a paper by F. P. Heiman entitled "On the Determination of Minority Carrier Lifetime From the Transient Response of an MOS Capacitor," published in the IEEE Transactions on Electron Devices, November 1967, p. 781.

This measurement technique indicated a carrier lifetime on the order of 10 to 300 microseconds, whereas the same measurement, when taken on a wafer processed as described above but without the addition of hydrogen chloride to the oxygen atmosphere, yielded a lifetime of 0.2 to 1.0 microsecond.

While the preferred embodiment of our process is directed to the use of hydrogen chloride, any hydrogen halide which does not remove the silicon dioxide insulating layer may be employed. In particular, hydrogen bromide and hydrogen iodide may be substituted for the hydrogen chloride.

While we prefer to carry out the heat treatment step in the hydrogen chloride/oxygen atmosphere at a temperature in the range of 1000° to 1200° C., this treatment may be satisfactorily accomplished at temperatures in the range of 800° to 1350° C. While our heat treatment step is carried out at an oxygen flow rate on the order of 1000 to 3000 cc. per minute, and at atmospheric pressure, other pressures and flow rates may be employed. While the preferred volumetric concentration of hydrogen chloride is on the order of 1%, good results are obtained with a volumetric concentration of 0.5%, and other concentrations in the range of 0.1 to 2% may be employed. On the other hand, a volumetric concentration of 10% results in reaction of the hydrogen chloride with the oxygen to produce water vapor; devices treated in the 10% hydrogen chloride atmosphere show negligible improvement in carrier lifetime, and pitting of the silicon surface.

The process of our invention may, e.g., be carried out in either a resistance heated or a cold wall (induction heated) furnace. Based upon the aforementioned and other data which we have obtained, heat treatment in an atmosphere comprising dry oxygen and hydrogen chloride, the atmosphere being substantially free of water vapor, results in an increase of carrier lifetime by a factor of 10 to 1000 or more. The absence of water vapor during our heat treatment process was confirmed by monitoring the oxidation rate of the silicon semiconductor material, it being well known that silicon oxidizes much more rapidly in water vapor than in a dry oxygen atmosphere.

Our process is particularly applicable to the manufacture of a light sensitive image pickup tube (hereinafter referred to as a silicon vidicon) which employs an electron beam addressed silicon diode array of the type shown in FIG. 1. Such a structure requires relatively high (on the order of 10 micro seconds or more) carrier lifetimes in the semiconductor material; such lifetimes may be reproducibly attained by the process of our invention.

In a silicon vidicon tube, a target 1 is scanned by a low velocity electron beam 2 emanating from a cathode 3. The electron beam 2 is formed, collimated, focussed, deflected and accelerated by a suitable electrongun structure (not shown). Typically the electron beam 2 may have a circular cross-section with a diameter on the order of 1 mil.

The target 1 comprises a substrate 4 of monocystalline semiconductor material, preferably silicon, of one conductivity type into which a large number of small regions 5 of opposite conducitivity type are diffused. Preferably, the substrate 4 is of N type conductivity and the diffused regions 5 are of P type conductivity. The diffused P type regions 5 are of a diameter substantially smaller than the diameter of the electron beam 2, so that the beam 2 subtends a number of the regions 5, thus making it unnecessary to register the beam 2 with the indiivdual regions.

Each of the diffused P type regions has a small P-N junction 6 to form a diode in conjunction with the substrate 4. The exposed surface of the substrate 4 adjacent the P type regions 5 is provided with a thin silicon dioxide coating 7 which overlies and protects the P-N junctions 6 where they extend to the semiconductor surface.

A thin surface layer 8 of relatively high electrical conductivity is disposed adjacent the opposite surface of the substrate 4, i.e. the surface which may be illuminated by a light image to be scanned. The conductive layer 8 may comprise a layer of N+ conductivity type formed by diffusion of a suitable donor impurity into the substrate 4. The conductive layer 8 and the substrate 4 are sufficiently thin so that carriers generated by the light incident upon the exposed surface of the layer 8 may penetrate the substrate 4 to reach the P-N junctions 6.

The substrate 4 is supported by a ring 9 of relatively thick semiconductor material, which may be secured to the inside envelope of the silicon vidicon tube.

Each of the P-N junctions 6 is reverse biased by means of (i) a voltage source 10, which may typically have a value on the order of 10 volts, and (ii) a load resistor 11, which may typically have a value on the order of several hundred thousand ohms. When the electron beam 2 is not scanning a particular P type region 5, the P-N junction 6 associated with that region is discharged by incident photons from the light image, the amount of discharge being dependent upon the photon flux. When the scanning electron beam 2 returns to this particular P-N junction, electrons flow to the P type region to provide a current which recharges the associated diode. This recharging current is directly related to the photon flux (light intensity) from the light image incident upon the P-N junction 6, and a corresponding voltage signal is developed across the load resistor 11. This signal is coupled to suitable amplified circuitry by means of a capacitor 12.

The incident light discharges the individual diodes by generating electron-hole pairs in the vicinity of the associated P-N junctions. These generated electrons and holes diffuse into the P-N junction region and are swept across the junction by the associated space charge field therein, thus serving to discharge the associated diodes. A number of the carriers created by the incident photons recombine and are lost, so that they do not contribute to discharge of the associated diodes. This recombination reduces the collection efficiency of the target 1, and directly degrades the sensitivity of the Silicon Vidicon.

The collection efficiency may be improved by increasing the bulk carrier lifetime and the surface recombination velocity of the semiconductor material comprising the target 1. Specifically, long carrier lifetimes and low recombination velocities provide high collection efficiency and therefore improve optical sensitivity.

The target 1 may be manufactured by providing a silicon substrate 4 of N type conductivity, having an N+ surface layer 8 diffused therein. To form the P type regions 5, the corresponding surface of the substrate 4 is coated with a thermally grown silicon dioxide layer 7, which may typically have a thickness on the order of 0.5 to 1 micron. The silicon dioxide layer 7 is grown in an atmosphere comprising dry oxygen and a volumetric concentration of hydrogen chloride on the order of 1%, in the manner previously described.

After the silicon dioxide layer has been grown, holes are etched therein exposing small regions of the substrate 4. A thin glassy layer containing a suitable acceptor impurity material is deposited on the semiconductor surface, and subsequently heated to form the diffused P type regions 5. Preferably, borosilicate glass may be employed as the impurity source. During or after the diffusion process, the borosilicate glass may be exposed to an atmosphere comprising hydrogen chloride, the atmosphere being substantially free of water vapor, in order to further improve the carrier lifetime of the semiconductor material in the manner previously described.

Thereafter, the portion of the borosilicate glass layer overlying the active P type regions 5 may be removed by photoetching.

We claim:

1. In a process for manufacturing a semiconductor device, comprising the steps of:

providing a substrate having a number of operating semiconductor regions forming at least one active semiconductor element, at least one of said regions being contiguous with a given surface of said substrate;

forming a layer of insulating material on said given surface overlying at least a part of said at least one region, said device including at least one deleterious metal ingredient;

exposing said layer to an atmosphere comprising a hydrogen halide; and heating said substrate to a given temperature sufficient to convert said metal to the metal halide and to volatilize the halide at the exposed surface of said insulating layer, thereby establishing a gradient for out-diffusion of said metal from said device toward said exposed surface, the improvement wherein said atmosphere is maintained substantially free of water vapor.

2. The improvement according to claim 1, wherein said atmosphere comprises (i) substantially dry oxygen and (ii) hydrogen chloride, hydrogen bromide or hydrogen iodide.

3. The improvement according to claim 1, wherein said semiconductor material comprises silicon and said insulating layer comprises silicon dioxide, at least a part of said silicon dioxide layer being thermally grown during at least a part of said exposing step.

4. The improvement according to claim 3, wherein said atmosphere includes dry oxygen and the volumetric concentration of said halide is less than 10%.

5. The improvement according to claim 4, wherein said halide comprises hydrogen chloride at a volumetric concentration in the range of 0.1 to 2%.

6. The improvement according to claim 4, wherein said halide comprises hydrogen chloride at a volumetric concentration on the order of 1%, said atmosphere being maintained at normal atmospheric pressure.

7. The improvement according to claim 3, wherein said atmosphere comprises dry oxygen and hydrogen chloride, and said thermally grown silicon dioxide is grown at a specified temperature in the range of 800° to 1350° C., said given temperature also being in the range of 800° to 1350° C.

8. The improvement according to claim 7, wherein said temperatures are in the range of 1000° to 1200° C.

9. The improvement according to claim 7, comprising the additional step of, after said insulating layer forming and exposing steps, annealing said device by heating said substrate in an atmosphere comprising hydrogen gas.

10. The improvement according to claim 9, wherein said atmosphere comprises hydrogen and said annealing step is carried out at a temperature on the order of 500° C. for a time on the order of at least 15 minutes.

11. A process for manufacturing an electron beam addressed semiconductor diode array target structure, comprising the steps of:

providing a substrate of monocrystalline semiconductor material of one conductivity type, said substrate including at least one deleterious metal ingredient;

forming an insulating layer on one surface of said substrate, said insulating layer having a plurality of apertures therein exposing corresponding areas of the substrate;

diffusing into said areas through said apertures a conductivity type determining impurity material to form in said areas a corresponding plurality of semiconductor regions of opposite conductivity type, with a P-N junction between each of said regions and said substrate;

exposing said insulating layer to an atmosphere comprising a hydrogen halide and substantially free of water vapor; and heating said substrate to a given temperature sufficient to convert said metal to the metal halide and to volatilize the halide at the exposed surface of said insulating layer, thereby establishing a gradient for out-diffusion for said metal from said exposed surface.

12. A target manufacturing process according to claim 11, wherein said semiconductor material comprises silicon.

13. A target manufacturing process according to claim 12, wherein said insulating layer comprises borosilicate glass or silicon dioxide.

References Cited

UNITED STATES PATENTS

| | | | |
|---|---|---|---|
| 2,953,486 | 9/1960 | Atalla | 148—191 |
| 3,007,820 | 11/1961 | McNamara | 148—191 |
| 3,085,033 | 4/1963 | Handelman | 148—191 |
| 3,162,557 | 12/1964 | Brock et al. | 148—191 |
| 3,183,128 | 5/1965 | Leistiko, Jr., et al. | 148—191 |
| 3,243,323 | 3/1966 | Corrigan et al. | 148—188UX |

L. DEWAYNE RUTLEDGE, Primary Examiner

R. A. LESTER, Assistant Examiner

U.S. Cl. X.R.

29—571; 148—187, 188, 189